United States Patent
Choh et al.

(10) Patent No.: US 9,640,517 B2
(45) Date of Patent: May 2, 2017

(54) STACKED ELECTRONIC PACKAGES

(71) Applicant: Carsem (M) SDN. BHD., Ipoh (MY)

(72) Inventors: Thong Kai Choh, Ipoh (MY); Lily Khor, Ipoh (MY); Oo Choo Yee, Ipoh (MY)

(73) Assignee: CARSEM (M) SDN. BHD., Ipoh (MY)

( * ) Notice: Subject to any disclaimer, the term of this patent is extended or adjusted under 35 U.S.C. 154(b) by 232 days.

(21) Appl. No.: 14/527,165

(22) Filed: Oct. 29, 2014

(65) Prior Publication Data

US 2015/0237721 A1  Aug. 20, 2015

(30) Foreign Application Priority Data

Feb. 19, 2014 (MY) .................. PI 2014700369

(51) Int. Cl.
*H01L 25/10* (2006.01)
*H01L 23/49* (2006.01)
*H01L 23/495* (2006.01)

(52) U.S. Cl.
CPC ...... *H01L 25/105* (2013.01); *H01L 23/49517* (2013.01); *H01L 23/49537* (2013.01); *H01L 23/49548* (2013.01); *H01L 23/49575* (2013.01); *H01L 23/49589* (2013.01); *H01L 23/49596* (2013.01); *H01L 2224/48091* (2013.01); *H01L 2224/48257* (2013.01); *Y10T 29/41* (2015.01)

(58) Field of Classification Search
CPC ............. H01L 25/105; H01L 23/49517; H01L 23/49537; H01L 2224/48091
USPC ........................................................ 361/773
See application file for complete search history.

(56) References Cited

U.S. PATENT DOCUMENTS

| 5,138,438 | A | * | 8/1992 | Masayuki ............... G11C 5/00 174/541 |
|---|---|---|---|---|
| 5,426,563 | A | | 6/1995 | Moresco et al. |
| 5,781,031 | A | | 7/1998 | Bertin et al. |
| 6,822,331 | B2 | | 11/2004 | Eytcheson |
| 7,071,573 | B1 | | 7/2006 | Lin |
| 7,642,128 | B1 | | 1/2010 | Lin et al. |
| 7,656,031 | B2 | | 2/2010 | Chen et al. |
| 7,772,046 | B2 | | 8/2010 | Pagaila et al. |

(Continued)

FOREIGN PATENT DOCUMENTS

| EP | 0 220 460 B1 | 12/1991 |
|---|---|---|
| WO | 0007240 A1 | 2/2000 |

OTHER PUBLICATIONS

Kisiel et al., "Trends in assembling of advanced IC packages" Journal of Telecommunications, (2005) 7 pages.

*Primary Examiner* — Eric Thomas
*Assistant Examiner* — Michael P McFadden
(74) *Attorney, Agent, or Firm* — Kilpatrick Townsend & Stockton LLP (57) ABSTRACT

A stacked electronic package includes a substrate and conductive straps each having sides, a top, and a bottom opposite the top. Each conductive strap is coupled along the bottom to an upper surface of the substrate and is separate from others of the conductive straps. A length of at least one of the sides is greater than a width of at least another one of the sides. An encapsulant extends over the upper surface and side surfaces of the substrate and the sides of the conductive straps. A passive electronic component is disposed over the conductive straps, and each conductive strap is coupled along the top to a terminal of the passive electronic component.

20 Claims, 5 Drawing Sheets

(56) References Cited

U.S. PATENT DOCUMENTS

| | | |
|---|---|---|
| 7,858,441 B2 | 12/2010 | Lin et al. |
| 7,935,570 B2 | 5/2011 | Lin et al. |
| 7,960,816 B2 | 6/2011 | Chow et al. |
| 8,076,784 B2 | 12/2011 | Brunnbauer et al. |
| 8,093,703 B2 * | 1/2012 | Kim ................... H01L 21/561 |
| | | 257/686 |
| 8,174,105 B2 | 5/2012 | Kwang et al. |
| 8,258,612 B2 | 9/2012 | Kuan |
| 8,263,437 B2 | 9/2012 | Lin et al. |
| 8,278,746 B2 | 10/2012 | Ding et al. |
| 8,334,586 B2 | 12/2012 | Otremba et al. |
| 8,349,657 B2 | 1/2013 | Do et al. |
| 8,503,186 B2 | 8/2013 | Lin et al. |
| 8,513,784 B2 | 8/2013 | Lu et al. |
| 8,519,544 B2 | 8/2013 | Kim et al. |
| 8,519,546 B2 | 8/2013 | Patti et al. |
| 2007/0235217 A1 | 10/2007 | Workman |
| 2010/0019362 A1 * | 1/2010 | Galera ............... H01L 23/4951 |
| | | 257/676 |
| 2010/0059853 A1 | 3/2010 | Lin et al. |
| 2010/0102327 A1 | 4/2010 | Standing |
| 2010/0140780 A1 | 6/2010 | Huang et al. |
| 2010/0244212 A1 | 9/2010 | Ha et al. |
| 2010/0258928 A1 * | 10/2010 | Chi .................... H01L 23/3677 |
| | | 257/686 |
| 2011/0024835 A1 | 2/2011 | Tiemeijer |
| 2011/0134613 A1 | 6/2011 | Moussaoui et al. |
| 2011/0140255 A1 | 6/2011 | Liu et al. |
| 2011/0227207 A1 | 9/2011 | Yilmaz et al. |
| 2011/0241192 A1 | 10/2011 | Ding et al. |
| 2011/0309454 A1 | 12/2011 | Ho et al. |
| 2012/0049334 A1 | 3/2012 | Pagaila et al. |
| 2012/0098050 A1 | 4/2012 | Shim et al. |
| 2012/0153472 A1 | 6/2012 | Pagaila et al. |
| 2012/0175784 A1 | 7/2012 | Lin et al. |
| 2012/0228696 A1 | 9/2012 | Carpenter et al. |
| 2012/0248539 A1 | 10/2012 | Zhang et al. |
| 2012/0286407 A1 | 11/2012 | Choi et al. |
| 2013/0001756 A1 | 1/2013 | Chen et al. |
| 2013/0001770 A1 | 1/2013 | Liu |
| 2013/0171806 A1 | 7/2013 | Shim et al. |
| 2014/0077389 A1 * | 3/2014 | Shim, II ............ H01L 23/49816 |
| | | 257/774 |
| 2014/0327014 A1 * | 11/2014 | Cheah ............... H01L 23/49524 |
| | | 257/76 |
| 2015/0223322 A1 * | 8/2015 | Ziglioli ................ H05K 1/0237 |
| | | 361/728 |

* cited by examiner

STACKED ELECTRONIC PACKAGES

CROSS-REFERENCES TO RELATED APPLICATIONS

This application claims priority to Malaysian Patent Application No. PI 2014700369, filed Feb. 19, 2014, the entire contents of which are incorporated herein by reference for all purposes.

FIELD OF THE INVENTION

Embodiments described herein relate in general to stacked electronic packages and, more particularly, to stacked electronic packages that include conductive straps electrically connecting upper packages or components to bottom substrates.

BACKGROUND

Some electronic packages combine one or more semiconductor dies and/or electronic components in a single package. Examples include system in package (SiP) and chip stack multi-chip module (MCM) packages. These packaging techniques typically stack a number of semiconductor dies vertically on top of each other in a single package. This is typically done to increase overall density for small electronic devices such as cell phones.

As the size of electronic devices continues to decrease and the demand for such devices increases, improvements are continuously sought that provide further integration of electronic devices.

SUMMARY

Some embodiments described herein provide stacked electronic packages of reduced size compared to conventional electronic packages. For example, in accordance with an embodiment, a stacked electronic package includes a substrate, a semiconductor die coupled to an upper surface of the substrate, and an electronic component coupled to the upper surface of the substrate. Conductive straps each having sides, a top, and a bottom opposite the top are coupled along the bottom to the upper surface of the substrate and spaced from the semiconductor die and the electronic component. At least one of the conductive straps is disposed on a first side of the semiconductor die and at least one of the conductive straps is disposed on a second side of the semiconductor die opposite the first side. Each conductive strap is separate from others of the conductive straps and a length of at least one of the sides is greater than a width of at least another one of the sides. An encapsulant extends over the semiconductor die, the electronic component, and the upper surface of the substrate and covers side surfaces of the substrate and the sides of the conductive straps. A passive electronic component is disposed over the semiconductor die and the electronic component. Each conductive strap is coupled along the top to a terminal of the passive electronic component.

In an embodiment, each conductive strap is electrically and structurally separate from others of the conductive straps.

In another embodiment, the passive electronic component is an inductor.

In another embodiment, the encapsulant directly contacts the sides of the conductive straps.

In another embodiment, the encapsulant covers an upper surface and sides of the passive electronic component.

In another embodiment, an upper surface and sides of the passive electronic component are exposed outside the encapsulant.

In some embodiments, the substrate includes a die pad surrounded by leads, and the semiconductor die is coupled to the die pad and the conductive straps are coupled to the leads. In other embodiments, the substrate is a printed circuit board (PCB).

Another embodiment provides a method of forming a stacked electronic package that includes providing a substrate, coupling a semiconductor die to an upper surface of the substrate, and coupling conductive straps to an upper surface of the substrate. Each conductive strap has sides, a top, and a bottom opposite the top and is coupled along the bottom to the upper surface of the substrate, and each conductive strap is separate from others of the conductive straps. At least one of the conductive straps is disposed on a first side of the semiconductor die and at least one of the conductive straps is disposed on a second side of the semiconductor die opposite the first side. An encapsulant layer is formed over the semiconductor die and the upper surface of the substrate. The encapsulant layer covers side surfaces of the substrate and sides of the conductive straps. The conductive straps are coupled to terminals of a passive electronic component that is disposed over the semiconductor die.

Yet another embodiment provides a method of forming a stacked electronic package that includes forming a first portion of the stacked electronic package by providing a first substrate, coupling a first semiconductor die to an upper surface of the first substrate, and coupling conductive straps to the upper surface of the first substrate. At least one of the conductive straps is disposed on a first side of the semiconductor die and at least one of the conductive straps is disposed on a second side of the semiconductor die opposite the first side. Each conductive strap has a length, a width, and a height, with the length being greater than the width. A first encapsulant layer is formed over the first semiconductor die and the upper surface of the first substrate. The encapsulant layer also covers side surfaces of the first substrate and sides of the conductive straps. The method also includes forming a second portion of the stacked electronic package by providing a second substrate that includes a plurality of terminals, coupling a second semiconductor die to an upper surface of the second substrate, and forming a second encapsulant layer over the second semiconductor die and the upper surface and sides of the second substrate. The conductive straps of the first portion of the stacked electronic package are coupled to the terminals of the second substrate of the second portion of the stacked electronic package. Each conductive strap extends between at least one of the terminals of the second substrate and the upper surface of the first substrate.

In an embodiment, the first semiconductor die is coupled to the first substrate using one or more bonding wires.

Numerous benefits may be realized using embodiments described herein over conventional techniques. For example, in some embodiments conductive straps can be used to electrically connect upper packages or components to bottom substrates. This can reduce package size compared to conventional techniques that use external contacts between stacked packages and/or components. In other embodiments, the conductive straps may be rigid and provide a particular minimum spacing between an upper package or component and a bottom substrate. Also, the conductive straps may be coupled to the bottom substrate prior to encapsulation. This can simplify manufacturing techniques and improve reliability by providing a durable, low-resistance connection. Depending on the embodiment, one or more of these benefits may exist. These and other embodiments, along with many other advantages and features, are described throughout the specification.

DETAILED DESCRIPTION

Figure 1:
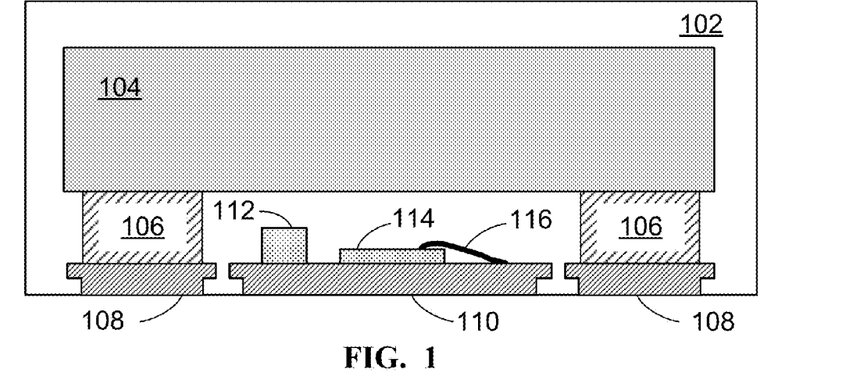
FIGS. 1-3 are simplified cross-sectional views of stacked electronic packages in accordance with some embodiments.
Figure 2:
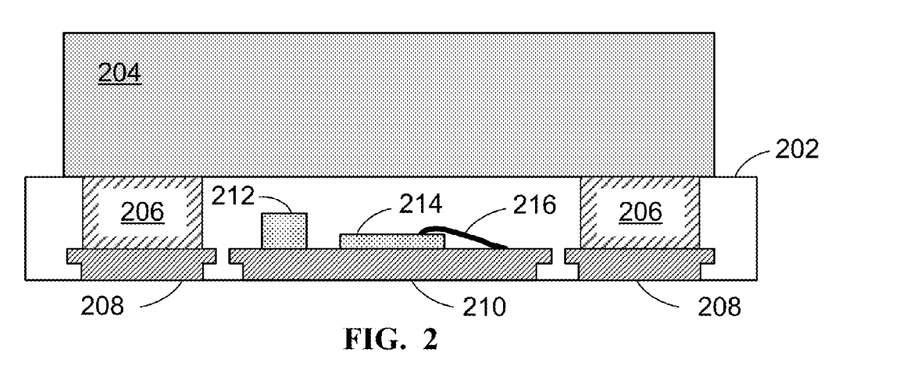
Figure 3:
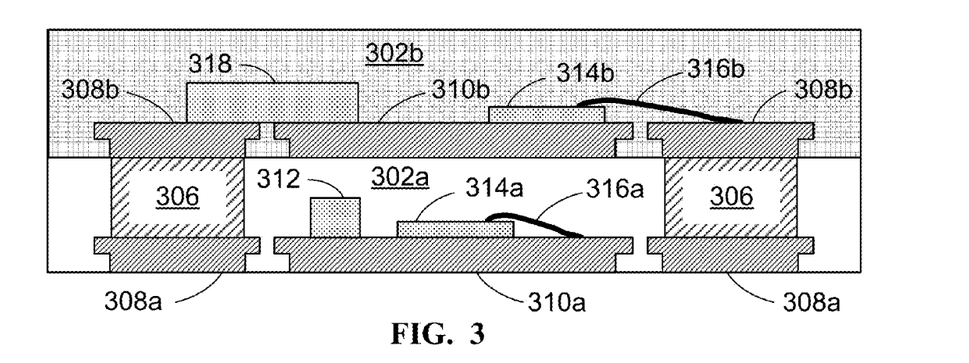

FIGS. 1-3 provide simplified cross-sectional views of stacked electronic packages that use conductive straps to connect an upper package or component to a bottom substrate. In the examples shown in these figures, the bottom substrate is part of a leadframe and includes a die pad surrounded by leads. In other embodiments, the bottom substrate may include a printed circuit board (PCB), a laminate substrate, a ceramic substrate, an organic substrate, or the like, and/or combinations of different types of substrates.

The example shown in FIG. 1 includes conductive straps 106 coupled to upper surfaces of leads 108. The conductive straps 106 are spaced from a semiconductor die 114 and an electronic component 112. One of the conductive straps 106 is disposed adjacent to the semiconductor die 114, and the other is disposed adjacent to the electronic component 112. The conductive straps 106 are electrically and structurally separate from each other. The conductive straps 106 may comprise any conductive material (e.g., metal and/or alloy) that provides a low resistance interconnect between the leads 108 and a passive electronic component 104. In some embodiments, the conductive straps 106 comprise at least one of copper or aluminum.

The semiconductor die 114 is coupled to an upper surface a die pad 110. The semiconductor die may be any type of integrated circuit (IC). In this example, a bond pad (not shown) on an upper surface of the semiconductor die 114 may be electrically coupled to the die pad 110 using a bonding wire 116 to form a ground bond. Alternatively, the bond pad on the upper surface of the semiconductor die 114 may be electrically coupled to a separate bond finger (not shown) separate from the die pad 110. The semiconductor die 114 may include a number of bond pads electrically coupled to the die pad 110 and/or the bond finger.

The electronic component 112 is also coupled to the upper surface of the die pad 110. The electronic component 112 may include one or more active or passive components such as resistors, capacitors, inductors, transistors, diodes, transformers, voltage sources, current sources, vacuum tubes, relays, glow tubes, and/or the like. The electronic component 112 may also include a combination of any of these components.

Although electronic components are included in each of the examples shown in FIGS. 1-3 (e.g., electronic components 112, 212, 312, 318), some embodiments may only include semiconductor dies (e.g., semiconductor die 114, 214, 314a, 314b) and may not include any electronic components. Alternatively, although semiconductor dies are included in each of the examples shown in FIGS. 1-3 (e.g., semiconductor dies 114, 214, 314a, 314b), some embodiments may only include electronic components (e.g., electronic components 112, 212, 312, 318) and may not include any semiconductor dies.

In the example shown in FIG. 1, the conductive straps 106 are coupled to the passive electronic component 104 that is disposed over the semiconductor die 114 and the electronic component 112. The passive electronic component 104 may include a passive electronic device such as a resistor, capacitor, inductor, transistor, diode, transformer, voltage source, current source, glow tube, and/or the like. The passive electronic component 104 may include terminals (not shown) on a bottom surface that are coupled to tops of the conductive straps 106. As illustrated in this example, the passive electronic component 104 may be larger than the electronic component 112 in some embodiments. Disposing the larger component on top can reduce package size.

In this example, an encapsulant 102 covers the passive electronic component 104 and sides of the conductive straps 106. The encapsulant 102 also covers the semiconductor die 114, the electronic component 112, and the upper and side surfaces of the leads 108 and the die pad 110. In an embodiment, the encapsulant 102 has direct contact with the sides of the conductive straps 106. This provides lower resistivity and improved reliability compared to conventional techniques that use plated vias or annular rings for electrical connection.

The example shown in FIG. 2 is similar to the example of FIG. 1 in that it includes conductive straps 206 coupled to upper surfaces of leads 208. This example also includes a semiconductor die 214 and an electronic component 212 coupled to an upper surface of a die pad 210. Terminals (not shown) of a passive electronic component 204 are coupled to tops of the conductive straps 206. An encapsulant 202 covers sides of the conductive straps 206 and also covers the semiconductor die 214, the electronic component 212, and the upper and side surfaces of the leads 208 and die pad 210. Each of these parts is similar to the corresponding part described above with regard to FIG. 1 and may include similar features.

The example shown in FIG. 2 is different from the example of FIG. 1 in that an upper surface and sides of the passive electronic component 204 are exposed outside the encapsulant 202. By placing the passive electronic component 204 outside the encapsulant 202, stress caused by a coefficient of thermal expansion mismatch between the passive electronic component 204 and the encapsulant 202 can be reduced or eliminated. Also, in this embodiment the passive electronic component 204 can be attached after encapsulation. This can simplify the encapsulation process and reduce packaging costs.

The example shown in FIG. 3 is similar to the examples of FIGS. 1-2 in that it also includes conductive straps 306 coupled to upper surfaces of leads 308a. This example also includes a semiconductor die 314a and an electronic component 312 coupled to an upper surface of a die pad 310a. An encapsulant 302a covers sides of the conductive straps 306 and also covers the semiconductor die 314a, the electronic component 312, and the upper and side surfaces of the leads 308a and die pad 310a. Each of these parts form a first portion of a stacked electronic package and is similar to the corresponding part described above with regard to FIGS. 1-2 and may include similar features.

The example shown in FIG. 3 is different from the examples of FIGS. 1-2 in that tops of the conductive straps 306 are coupled to leads 308b of a second portion of the stacked electronic package. The second portion of the stacked electronic package includes an electronic component 318 coupled to an upper surface of one of the leads 308b and the die pad 310b. A semiconductor die 314b is also coupled to the upper surface of the die pad 310b and electrically coupled to the upper surface of one of the leads 308b using a bonding wire 316b. An encapsulant 302b covers the semiconductor die 314b, the electronic component 318, and the upper surface and sides of the leads 308b and die pad 310b.

Each of these parts may be the same as the corresponding part in the first portion of the stacked electronic package or different from the corresponding part. For example, the semiconductor die 314a may be a different type of an IC than semiconductor die 314b, and the electronic component 312 may be a different type of component than the electronic component 318. Similarly, the encapsulant 302a may be comprised of the same or different material as the encapsulant 302b. Also, either or both of the first and second portions of the stacked electronic package may not include a semiconductor die. Similarly, either or both of the first and second portions of the stacked electronic package may not include an electronic component. Further, the electronic component 318 may be coupled only to one of the leads 308b or only to the die pad 310b rather than to both of them as shown in this particular example.

FIGS. 4A-4D are simplified cross-sectional views illustrating a method of forming a stacked electronic package in accordance with an embodiment. The stacked electronic package in this embodiment (shown in FIG. 4D) is similar to that of FIG. 1, and each of the parts may be configured and/or arranged in a manner similar to the corresponding part in FIG. 1 described above.

Figure 4A:
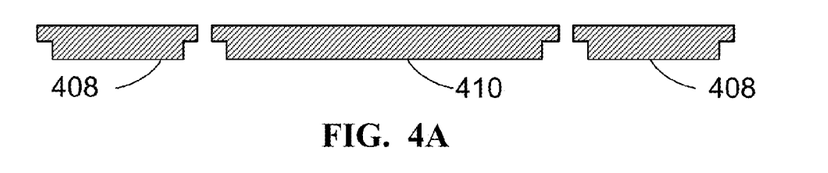
FIGS. 4A-4D are simplified cross-sectional views illustrating a method of forming a stacked electronic package in accordance with an embodiment.

In FIG. 4A, a substrate is provided that includes leads 408 and a die pad 410. As explained above, other types of substrates may also be used.

Figure 4B:
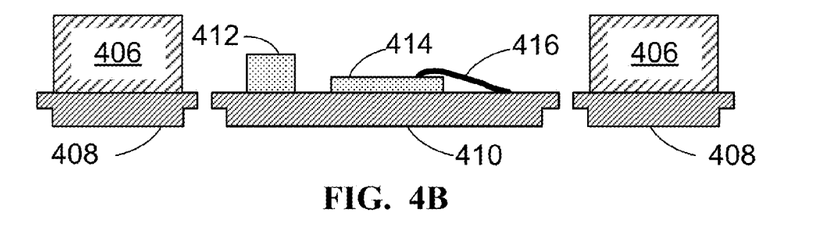

In FIG. 4B, bottoms of conductive straps 406 are coupled to the leads 408. Bottoms of a semiconductor die 414 and an electronic component 412 are coupled to an upper surface of the die pad 410. A bond pad (not shown) on an upper surface of the semiconductor die 414 may be electrically coupled to the die pad 410 using a bonding wire 416 to form a ground bond. Alternatively, the bond pad on the upper surface of the semiconductor die 414 may be electrically coupled to a separate bond finger (not shown) separate from the die pad 410. As explained above, the semiconductor die 414 may include a number of bond pads electrically coupled to the die pad 410 and/or the bond finger. Other interconnection techniques, such as flip-chip or soldering, may alternatively be used.

The conductive straps 406, semiconductor die 414, and electronic component 412 may each be coupled to the bottom substrate (e.g., to the leads 408 and/or the die pad 410) using known adhesive and/or soldering techniques that may involve dispensing or printing processes. For example, in one embodiment the conductive straps 406 may be pre-formed in a particular shape (e.g., an oblong metal bar) and coupled to the leads 408. The materials used to couple the conductive straps 406 to the leads 408 may be electrically conductive (e.g., a conductive paste), while the materials used to couple the semiconductor die 414 and electronic component 412 to the die pad 410 may be either electrically conductive or insulating. In another embodiment, the conductive straps 406 may be formed on the leads 408 using a stencil and solder paste in accordance with known techniques that may include a cure using a known reflow process. In some embodiments, the bonding wire 416 may be attached following reflow.

Figure 4C:
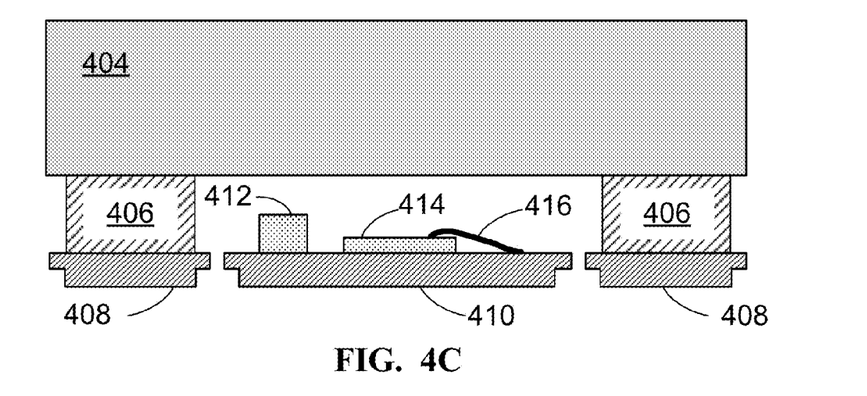

In FIG. 4C, a passive electronic component 404 is coupled to the conductive straps 406. Terminals (not shown) on a bottom surface of the passive electronic component 404 may be coupled to tops of the conductive straps 406 using known materials (e.g., adhesive, solder, paste, etc.) and conventional techniques. The conductive straps 406 may be of a particular height that minimizes package height while providing sufficient spacing between tops of the semiconductor die 414 (and bonding wire 416) and electronic component 412 and the bottom surface of the passive electronic component 404.

Figure 4D:
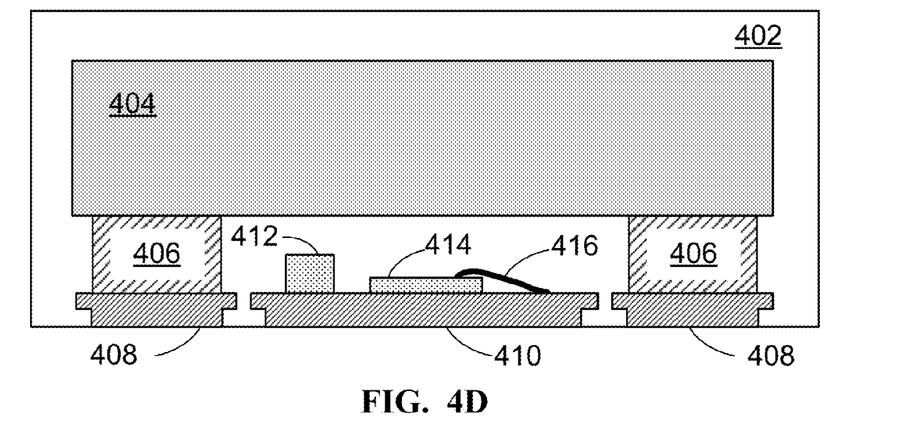

In FIG. 4D, an encapsulant 402 is formed over the semiconductor die 414, the electronic component 412, and the upper surface and sides of the leads 408 and die pad 410. The encapsulant is also formed over the passive electronic component 404 and covers sides of the conductive straps 406. The encapsulant 402 may be formed using known molding techniques (e.g., injection molding, transfer molding, compression molding, or the like). The encapsulant 402 may be any encapsulant used in semiconductor packaging including a conventional injection mold compound such as a Fortron® PPS polymer manufactured by Celanese Corporation.

FIGS. 5A-5D are simplified cross-sectional views illustrating a method of forming a stacked electronic package in accordance with another embodiment. The stacked electronic package in this embodiment (shown in FIG. 5D) is similar to that of FIG. 2, and each of the parts may be configured and/or arranged in a manner similar to the corresponding part in FIG. 2 described above.

Figure 5A:
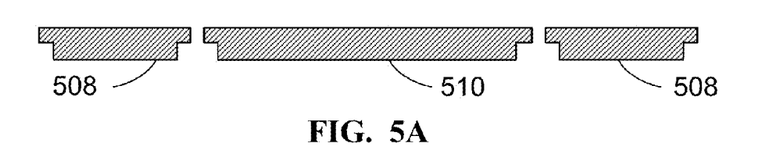
FIGS. 5A-5D are simplified cross-sectional views illustrating a method of forming a stacked electronic package in accordance with another embodiment.
Figure 5B:
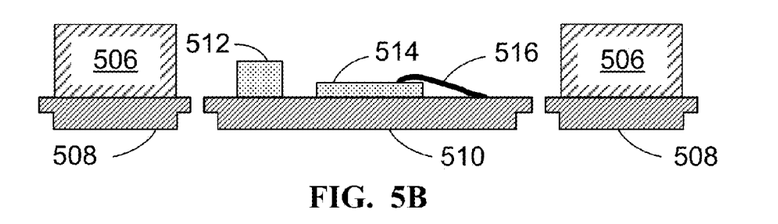

FIGS. 5A-5B are similar to FIGS. 4A-4B. In FIG. 5A, a substrate is provided that includes leads 508 and a die pad 510. In FIG. 5B, bottoms of conductive straps 506 are coupled to the leads 508, and bottoms of a semiconductor die 514 and an electronic component 512 are coupled to an upper surface of the die pad 510. As explained above, the conductive straps 506 may be pre-formed in a particular shape (e.g., an oblong metal bar) and coupled to the leads 508, or the conductive straps 506 may be formed on the leads 508 in accordance with known techniques (e.g., stencil and solder paste). The solder paste may be cured using a known reflow process. A bond pad (not shown) on an upper surface of the semiconductor die 514 may be electrically coupled to the die pad 510 using a bonding wire 516 to form a ground bond. Alternatively, the bond pad on the upper surface of the semiconductor die 514 may be electrically coupled to a separate bond finger (not shown) separate from the die pad 510.

Figure 5C:
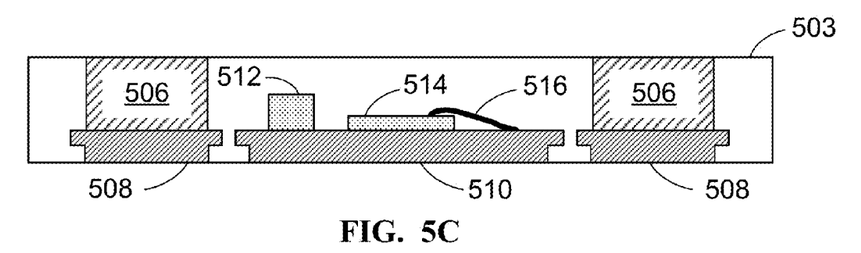
Figure 5D:
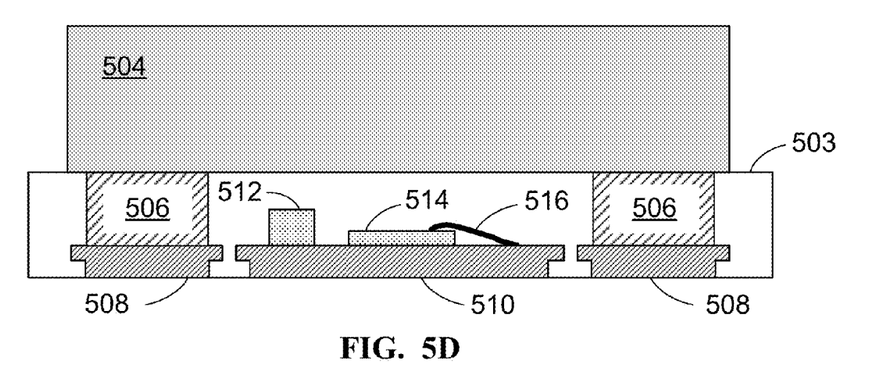

In FIG. 5C, an encapsulant 503 is formed over the semiconductor die 514, the electronic component 512, and the upper surface and sides of the leads 508 and die pad 510. The encapsulant 503 also covers sides of the conductive straps 506. The encapsulant 503 may be formed using known molding techniques as described above with regard to the encapsulant 402 in FIG. 4D. In an embodiment, the encapsulant 503 may be formed over tops of the conductive straps 506 using known overmolding techniques. A portion of the encapsulant 503 extending over the conductive straps 506 may be removed using known backgrind techniques to expose the tops of the conductive straps 506 outside the encapsulant 503.

In FIG. 5C, a passive electronic component 504 is coupled to the tops of the conductive straps 506. Unlike FIG. 4D, however, in this embodiment the encapsulant 503 does not cover an upper surface and sides of the passive electronic component 504. Instead, the upper surface and sides of the passive electronic component 504 are exposed outside the encapsulant 503.

FIGS. 6A-6D are simplified cross-sectional views illustrating a method of forming a stacked electronic package in accordance with yet another embodiment. The stacked electronic package in this embodiment (shown in FIG. 6C) is similar to that of FIG. 3, and each of the parts may be configured and/or arranged in a manner similar to the corresponding part in FIG. 3 described above.

Figure 6A:
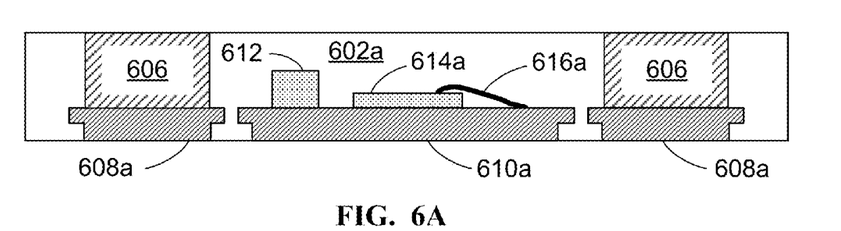
FIGS. 6A-6C are simplified cross-sectional views illustrating a method of forming a stacked electronic package in accordance with yet another embodiment.

In FIG. 6A, a first portion of the stacked electronic package is formed by providing a first substrate. In this example, the first substrate includes leads 608a and a die pad 610a. Bottoms of conductive straps 606 are coupled to the leads 608a, and bottoms of a semiconductor die 614a and an electronic component 612 are coupled to an upper surface of the die pad 610a. A bond pad (not shown) on an upper surface of the semiconductor die 614a may be electrically coupled to the die pad 610a using a bonding wire 616a to form a ground bond. Alternatively, the bond pad on the upper surface of the semiconductor die 614a may be electrically coupled to a separate bond finger (not shown) separate from the die pad 610a. As explained above, the conductive straps 606, semiconductor die 614a, and electronic component 612 may each be coupled to the bottom substrate (e.g., to the leads 608a and/or the die pad 610a) using known techniques. The conductive straps 606 may be formed as described previously.

An encapsulant 602a is formed over the semiconductor die 614a, the electronic component 612, and the upper surface and sides of the leads 608a and die pad 610a. The encapsulant also covers sides of the conductive straps 606. Bottom surfaces of the leads 608a and the die pad 610a may be exposed outside the encapsulant 602a. In an embodiment, the encapsulant 602a may be formed over tops of the conductive straps 606 using known overmolding techniques. A portion of the encapsulant 602a extending over the conductive straps 606 may be removed using known backgrind techniques to expose the tops of the conductive straps 606 outside the encapsulant 602a.

Figure 6B:
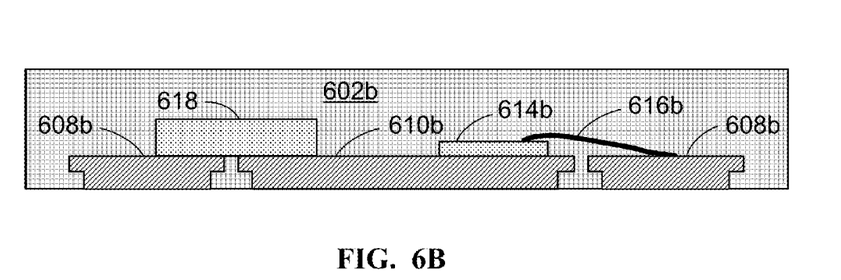

In FIG. 6B, a second portion of the stacked electronic package is formed by providing a second substrate. In this example, the second substrate includes leads 608b and a die pad 610b. As explained above, other types of substrates may also be used.

Bottoms of a semiconductor die 614b and an electronic component 618 are coupled to an upper surface of the die pad 610b. A bond pad (not shown) on an upper surface of the semiconductor die 614b is electrically coupled to one of the leads 608b using a bonding wire 616b. As explained above, the semiconductor die 614a may include a number of bond pads electrically coupled to one or more of the leads 608b and/or the die pad 610b. Other interconnection techniques, such as flip-chip or soldering, may alternatively be used. The materials used to couple the semiconductor die 614b and electronic component 618 to the leads 608b and the die pad 610b may be either electrically conductive or insulating.

An encapsulant 602b is formed over the semiconductor die 614b, the electronic component 618, and the upper surface and sides of the leads 608b and die pad 610b. Bottom surfaces of the leads 608b and the die pad 610b may be exposed outside the encapsulant 602b. The encapsulant 602b may be formed using known molding materials and techniques.

Figure 6C:
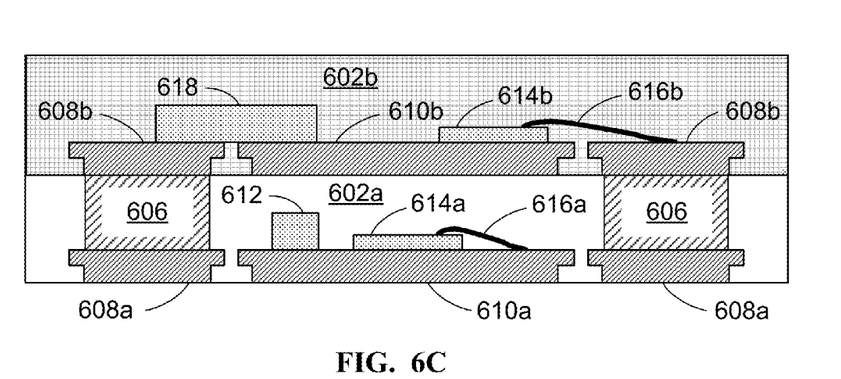

In FIG. 6C, tops of the conductive straps 606 of the first portion of the stacked electronic package are coupled to the leads 608b of the second portion of the stacked electronic package. Each conductive strap 606 extends between at least one of the leads 608b and the leads 608a. The top of the conductive straps 606 may be couple to the leads 608b using known techniques (e.g., adhesives, soldering, etc.). The materials used to couple the conductive straps 606 to the leads 608b may be electrically conductive (e.g., a conductive paste).

With the conductive straps 606 of the first portion of the stacked electronic package coupled to the second portion of the stacked electronic package, the bottom of the die pad 610b is adjacent to the encapsulant 602a. The bottom surfaces of the leads 608a and/or the die pad 610a may be exposed outside the stacked electronic package.

It should be appreciated that the specific steps illustrated in FIGS. 4A-4D, 5A-5D, and 6A-6C provide particular methods of forming stacked electronic packages in accordance with some embodiments. Other sequences of steps may also be performed according to alternative embodiments. For example, the steps outlined above may be performed in a different order. Moreover, the individual steps illustrated in FIGS. 4A-4D, 5A-5D, and 6A-6C may include multiple sub-steps that may be performed in various sequences as appropriate. Furthermore, additional steps may be added or removed depending on the particular application.

FIGS. 7A-7D are simplified perspective views of conductive straps in accordance with some embodiments. The conductive straps shown in these figures are provided merely as examples and are not intended to be limiting. In some embodiments, the conductive straps may be rigid and provide a particular minimum spacing between an upper package or component and a bottom substrate.

Figure 7A:
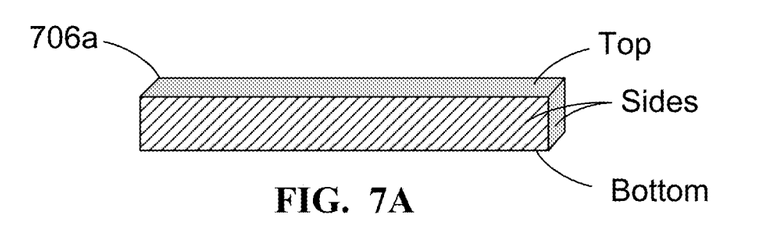
FIGS. 7A-7D are simplified perspective views of conductive straps in accordance with some embodiments.

FIG. 7A shows a conductive strap 706a in the shape of a rectangular bar (or an oblong metal bar). In this example, a length of the front and back sides of the conductive strap 706a is greater than a width of each end. As described previously, a bottom of the conductive bar 706a may be coupled to a substrate and a top may be coupled to a passive electronic component or to another substrate depending on the embodiment.

Figure 7B:
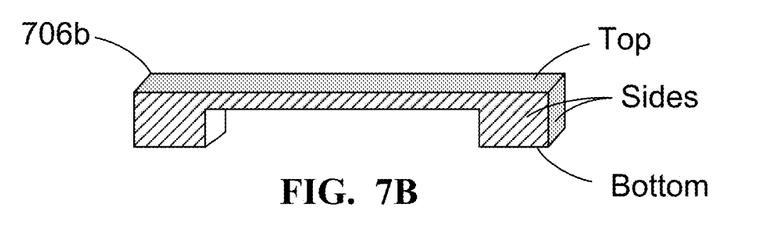
Figure 7C:
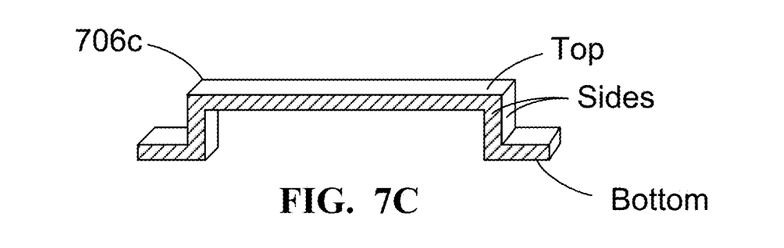
Figure 7D:
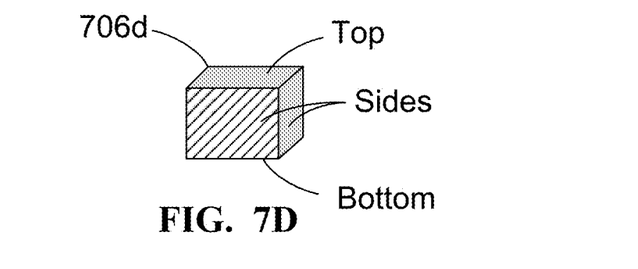

FIG. 7B shows a conductive strap 706b that is also in the shape of a rectangular bar, except in this example the conductive strap 706b includes a cutout along a center bottom of the conductive bar 706b. Other embodiments may use a similar shape except that the cutout may be along a center top. FIG. 7C shows a conductive strap 706c that includes a cutout along a center bottom of the conductive bar 706c as well as cutouts on each top end. Other embodiments may use a similar shape except that the cutout may be along a center top with cutouts on each bottom end. FIG. 7D shows a conductive strap 706d that is in the shape of a cube. The conductive strap 706d may or may not have a length of at least one of the sides that is greater than a width of at least another one of the sides. These different shapes may be useful or even necessary for some substrate types and/or configurations (or passive electronic component types and/or configurations).

The conductive straps shown in FIGS. 7A-7D can provide durable, low resistance connections between a lower substrate and an upper passive electronic component or substrate. The conductive straps also provide a consistent size (length, width, and height) compared to conventional via etch techniques that must account for variations in a number of processes (e.g., film deposition, photolithography, etch, clean, metal deposition, etc.). The reduced variation can improve yield, enable a reduction in package size, and reduce packaging costs.

While the present invention has been described in terms of specific embodiments, it should be apparent to those skilled in the art that the scope of the present invention is not limited to the embodiments described herein. For example, features of one or more embodiments may be combined with one or more features of other embodiments without departing from the scope of the invention. The specification and drawings are, accordingly, to be regarded in an illustrative rather than a restrictive sense. Thus, the scope of the present invention should be determined not with reference to the above description but with reference to the appended claims along with their full scope of equivalents.

What is claimed is:

1. A stacked electronic package, comprising: a substrate; a semiconductor die coupled to a first portion of an upper surface of the substrate, the semiconductor die comprising an integrated circuit; a discrete electronic component coupled to a second portion of the upper surface of the substrate, the discrete electronic component being separate from the semiconductor die, and the first portion of the upper surface of the substrate being different from the second portion of the upper surface; conductive straps each having sides, a top, and a bottom opposite the top, each conductive strap coupled along the bottom to the upper surface of the substrate and spaced from the semiconductor die and the discrete electronic component, a first one of the conductive straps disposed on a first side of the semiconductor die and a second one of the conductive straps disposed on a second side of the semiconductor die opposite the first side, each conductive strap being separate from others of the conductive straps and a length of at least one of the sides [of each conductive strap being greater than a width of at least another one of the sides; an encapsulant extending over the semiconductor die, the discrete electronic component, and the upper surface of the substrate and covering side surfaces of the substrate and the sides of the conductive straps; and a discrete passive electronic component disposed over the semiconductor die and the discrete electronic component, each conductive strap coupled along the top to a terminal of the discrete passive electronic component, each conductive strap extending between the substrate and the discrete passive electronic component without extending over the semiconductor die and the discrete electronic component, and each conductive strap including a cutout along the bottom.

2. The stacked electronic package of claim 1 wherein each conductive strap is electrically and structurally separate from others of the conductive straps.

3. The stacked electronic package of claim 1 wherein the discrete passive electronic component is an inductor.

4. The stacked electronic package of claim 1 wherein the encapsulant directly contacts the sides of the conductive straps.

5. The stacked electronic package of claim 1 wherein the encapsulant covers an upper surface and sides of the discrete passive electronic component.

6. The stacked electronic package of claim 1 wherein an upper surface and sides of the discrete passive electronic component are exposed outside the encapsulant.

7. The stacked electronic package of claim 1 wherein the substrate includes a die pad surrounded by leads, and the semiconductor die is coupled to the die pad and the conductive straps are coupled to the leads.

8. The stacked electronic package of claim 1 wherein the substrate is a printed circuit board (PCB).

9. A method of forming a stacked electronic package, the method comprising: providing a substrate; coupling a semiconductor die to a first portion of an upper surface of the substrate, the semiconductor die comprising an integrated circuit; coupling a discrete electronic component to a second portion of the upper surface of the substrate, the discrete electronic component being separate from the semiconductor die, and the first portion of the upper surface of the substrate being different from the second portion of the upper surface; coupling conductive straps to an upper surface of the substrate, each conductive strap having sides, a top, and a bottom opposite the top, each conductive strap being coupled along the bottom to the upper surface of the substrate and being separate from others of the conductive straps, a first one of the conductive straps disposed on a first side of the semiconductor die and a second one of the conductive straps disposed on a second side of the semiconductor die opposite the first side; thereafter forming an encapsulant layer over the semiconductor die, the discrete electronic component, and the upper surface of the substrate, the encapsulant layer covering &de surfaces of the substrate and sides of the conductive straps; and coupling the conductive straps to terminals of a discrete passive electronic component that is disposed over the semiconductor die, wherein each conductive strap extends between the substrate and the discrete passive electronic component without extending over the semiconductor die and the discrete electronic component, and each conductive strap includes a cutout along the bottom.

10. The method of claim 9 wherein each conductive strap is electrically and structurally separate from others of the conductive straps.

11. The method of claim 9 wherein the encapsulant layer directly contacts the sides of the conductive straps.

12. The method of claim 9 wherein the encapsulant layer is also formed over an upper surface and sides of the discrete passive electronic component.

13. The method of claim 9 wherein an upper surface and sides of the discrete passive electronic component are exposed outside the encapsulant layer.

14. The method of claim 9 wherein the substrate includes a die pad surrounded by leads, and the semiconductor die is coupled to the die pad and the conductive straps are coupled to the leads.

15. The method of claim 9 wherein the discrete passive electronic component is an inductor that is larger in size than the semiconductor die.

16. A method of forming a stacked electronic package, the method comprising: forming a first portion of the stacked electronic package by: providing a first substrate; coupling a first semiconductor die to a first portion of an upper surface of the first substrate, the first semiconductor die comprising a first integrated circuit; coupling a discrete electronic component to a second portion of the upper surface of the first substrate, the discrete electronic component being separate from the first semiconductor die, and the first portion of the upper surface of the first substrate being different from the second portion of the upper surface; coupling conductive straps to the upper surface of the first substrate, a first one of the conductive straps disposed on a first side of the semiconductor die and a second one of the conductive straps disposed on a second side of the semiconductor die opposite the first side, each conductive strap having a length, a width, and a height where the length is greater than the width; and thereafter forming a first encapsulant layer over the first semiconductor die the discrete electronic component, and the upper surface of the first substrate, the encapsulant layer also covering side surfaces of the first substrate and sides of the conductive straps; forming a second portion of the stacked electronic package by: providing a second substrate that includes a plurality of terminals; coupling a second semiconductor die to an upper surface of the second substrate, the second semiconductor die comprising a second integrated circuit; and forming a second encapsulant layer over the second semiconductor die and the upper surface and sides of the second substrate; coupling the conductive straps of the first portion of the stacked electronic package to the terminals of the second substrate of the second portion of the stacked electronic package, each conductive strap extending between at least one of the terminals and the upper surface of the first substrate without extending over the first semiconductor die or the discrete electronic component, and each conductive strap including a cutout along the bottom.

17. The method of claim 16 wherein the encapsulant layer directly contacts each of the sides of the conductive straps.

18. The method of claim 16 wherein the first semiconductor die is coupled to the first substrate using one or more bonding wires.

19. The method of claim 16 wherein the first substrate includes a die pad surrounded by leads, and the first semiconductor die is coupled to the die pad and the conductive straps are coupled to the leads.

20. The method of claim 16 wherein the first substrate is a printed circuit board (PCB).

* * * * *